United States Patent [19]
Schumacher

[11] Patent Number: 5,223,742
[45] Date of Patent: Jun. 29, 1993

[54] CIRCUIT AND METHOD FOR MONITORING A PULSE WIDTH MODULATED WAVEFORM

[76] Inventor: Mark E. Schumacher, 4265 N. Napoleon Rd., Lima, Ohio 45801

[21] Appl. No.: 744,756

[22] Filed: Aug. 14, 1991

[51] Int. Cl.[5] .................. H03K 5/22; H03K 3/017
[52] U.S. Cl. ............................ 307/234; 307/265; 328/129.1; 328/61; 377/39
[58] Field of Search .............. 377/39; 307/234, 265; 328/61, 111, 129.1

[56] References Cited

U.S. PATENT DOCUMENTS

| | | | |
|---|---|---|---|
| 4,302,665 | 11/1981 | Hoenig | 377/39 |
| 4,566,111 | 1/1986 | Tanagawa | 377/39 |
| 4,675,597 | 6/1987 | Hernandez | 307/234 |
| 4,870,664 | 9/1989 | Hayashi | 377/44 |
| 4,870,665 | 9/1989 | Vaughn | 377/39 |
| 4,982,109 | 1/1991 | Burwell | 307/265 |
| 4,989,223 | 1/1991 | Katayose et al. | 377/39 |

Primary Examiner—Timothy P. Callahan
Attorney, Agent, or Firm—Michael S. Yatsko

[57] ABSTRACT

A pulse width modulated waveform measurement circuit is provided with a detector for detecting logic level transitions in a pulse width modulated waveform during a measurement interval, a counter for counting clock pulses, and a gate circuit for enabling the counter during a time period corresponding to the width of a preselected pulse in the pulse width modulated waveform. A comparison circuit is provided for comparing the output count from the counter with a predetermined count and for comparing the number of logic level transitions detected during the measurement interval with a predetermined number to obtain an indication of the operational status of the pulse width modulated waveform. In an alternative embodiment, the gate circuit enables the counter during time periods corresponding to the widths of successive pulses in the pulse width modulated waveform. Successive output counts are stored in real time and compared to successive predetermined counts to obtain an indication of the operational status of the pulse width modulated waveform. The polarity of the pulse width modulated waveform is also monitored to provide an additional indication of the operational status of the waveform.

12 Claims, 21 Drawing Sheets

CIRCUIT AND METHOD FOR MONITORING A PULSE WIDTH MODULATED WAVEFORM

BACKGROUND OF THE INVENTION

This invention relates to circuits and methods for monitoring voltage pulses in electronic circuits, and more particularly, to such circuits and methods for monitoring pulse width modulated waveforms produced by inverter drive logic circuits.

Electronic inverters which convert DC voltage to a constant frequency AC output voltage incorporate inverter drive logic circuits which drive power switching devices to produce a quasi sine wave which is filtered to produce a sine wave output. The inverter drive logic circuit produces several pulse width modulated waveforms which can be combined to produce a single composite transistor-transistor logic (TTL) signal corresponding to all inverter drive logic outputs. A technique is required for testing the inverter drive logic pulse width modulated waveforms and other pulse width modulated waveform patterns. This invention provides circuits and measurement techniques which perform the necessary test function.

SUMMARY OF THE INVENTION

Pulse width modulated waveform measurement circuits constructed in accordance with this invention include a detector circuit for detecting logic level transitions in a pulse width modulated waveform during a measurement interval, a timer/counter for counting clock pulses, and a gate circuit for enabling the timer/counter during a time period corresponding to the width of a preselected pulse in the pulse width modulated waveform. The measurement circuit also includes means for comparing an output count, representative of the width of the preselected pulse, from the counter with a predetermined count, and for comparing the number of logic level transitions in the pulse width modulated waveform, sensed by the pulse counter, during the measurement interval, with a predetermined number to obtain an indication of the operational status of the pulse width modulated waveform. By monitoring both the widths of selected pulses in the pulse width modulated waveform, as well as the number of logic level transitions during the measurement interval, a reliable indication of the operational status of the input waveform can be obtained. The circuit also acquires the polarity of the preselected pulse and compares the pulse polarity to a predetermined value to provide an additional indication of the operational status of input waveform.

This invention also encompasses a pulse width modulated waveform measurement method which includes the steps of detecting logic level transitions in a pulse width modulated waveform during a measurement interval, counting clock pulses, and enabling the counting of clock pulses during a time period corresponding to the width of a preselected pulse in the pulse width modulated waveform. The output count, representative of the width of the preselected pulse, is compared with a predetermined count and the number of logic level transitions in the pulse width modulated waveform during the measurement interval is compared with a predetermined number to obtain an indication of the operational status of the pulse width modulated waveform. In addition, the polarity of he preselected pulse is also acquired and compared to a predetermined value.

This invention further encompasses a pulse width modulated waveform measurement circuit including a circuit for detecting logic level transitions in a pulse width modulated waveform during a measurement interval, a counter for counting clock pulses, and a reset circuit for resetting the counter after each successive time period corresponding to the widths of successive pulses in the pulse width modulated waveform. A storage device is provided for storing successive output counts from the counter wherein each of the output counts corresponds to the width of one of the successive pulses, and means for successively comparing at least a portion of each of the output counts from the counter with one of a plurality of predetermined counts to obtain an indication of the operational status of the pulse width modulated waveform.

The invention also encompasses a pulse width modulated waveform measurement method which comprises the steps of detecting logic level transitions in a pulse width modulated waveform during a measurement interval, counting clock pulses, and resetting such counting after successive time periods corresponding to the width of successive pulses in the pulse width modulated waveform. Output counts produced by the counter are stored and successively compared with each of a plurality of predetermined counts to obtain an indication of the operational status of the pulse width modulated waveform.

The circuits and methods of this invention can be used to perform built-in test or self-test functions of inverter drive logic circuit operation prior to or during energization of the inverter. This invention can be easily implemented in digital circuitry.

BRIEF DESCRIPTION OF THE DRAWINGS

This invention will be more readily apparent to those skilled in the art in view of the following description of the preferred embodiments thereof, as illustrated in the drawings wherein.

DESCRIPTION OF THE PREFERRED EMBODIMENTS

Figure 1:
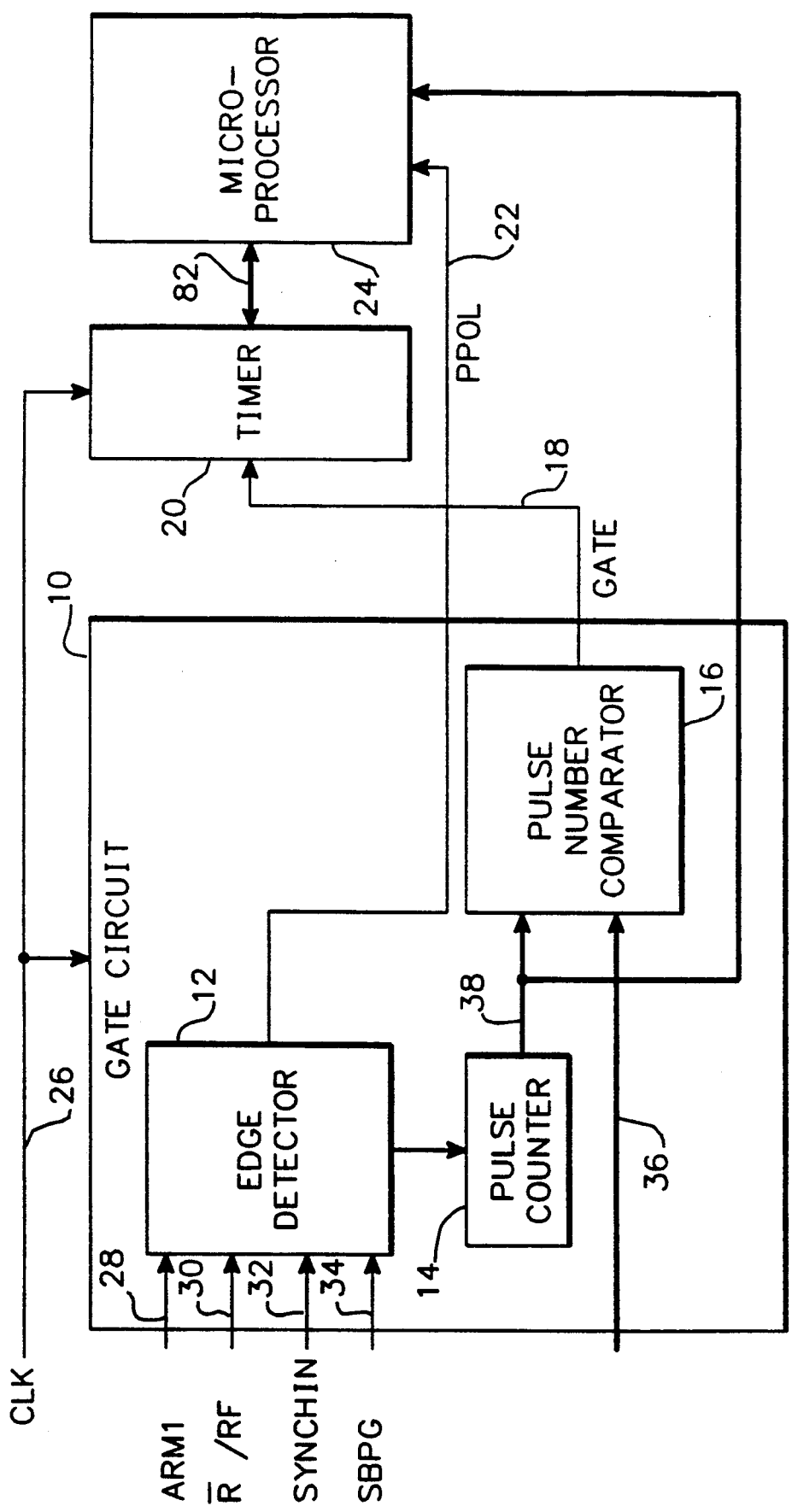
FIG. 1 is a block diagram of a pulse width modulated waveform measurement circuit constructed in accordance with one embodiment of the present invention.

Referring to the drawings, FIG. 1 is a block diagram of a pulse width modulated waveform measurement circuit constructed in accordance with one embodiment of the present invention. The circuit comprises a gate circuit 10 including an edge detector 12, a pulse counter 14, and a pulse number comparator 16. The gate circuit is used to produce a GATE signal on line 18 which controls the operation of a timer 20. The gate circuit also produces a pulse polarity signal PPOL on line 22 which is representative of logic level of the pulse width modulated waveform being measured. Signal PPOL is delivered to a microprocessor 24. A clock signal CLK which is produced by an external clock is delivered to the measurement circuit by way of line 26. Line 28 receives an ARM1 signal which is a logic signal that is used to initialize the gate circuit and to initiate a pulse width measurement acquisition cycle. Input signal $\overline{R}$/RF on line 30 is used to program which edges are to be sensed by the gate circuit. In the preferred embodiment, when $\overline{R}$/RF is set to 1, both rising and falling edges are sensed. When $\overline{R}$/RF is set to 0, only rising edges are sensed. The SYNCHIN signal on line 32 is the periodic pulse width modulated TTL input signal which is being measured. Input signal SBPG on line 34 is used to control when pulses are to be sensed by the gate circuit by identifying a period or frame of pulses. After the gate circuit is armed, the first rising edge of signal SBPG marks the beginning of the measurement cycle in which transitions of SYNCHIN are sensed. These transitions are continued to be sensed until one transition of SYNCHIN is sensed after the next rising edge of signal SBPG. A data bus input 36 receives a plurality of binary signals identified as signals IDLA0, IDLA1, . . . IDLA7, which are used to select a particular pulse of the input pulse train to be selected for measurement. When the binary number on data bus 36 matches the binary number of data bus 38 (which is produced by pulse counter 14), the pulse number comparator 16 produces a transition in the GATE signal thereby controlling the operation of timer 20.

Figure 2A:
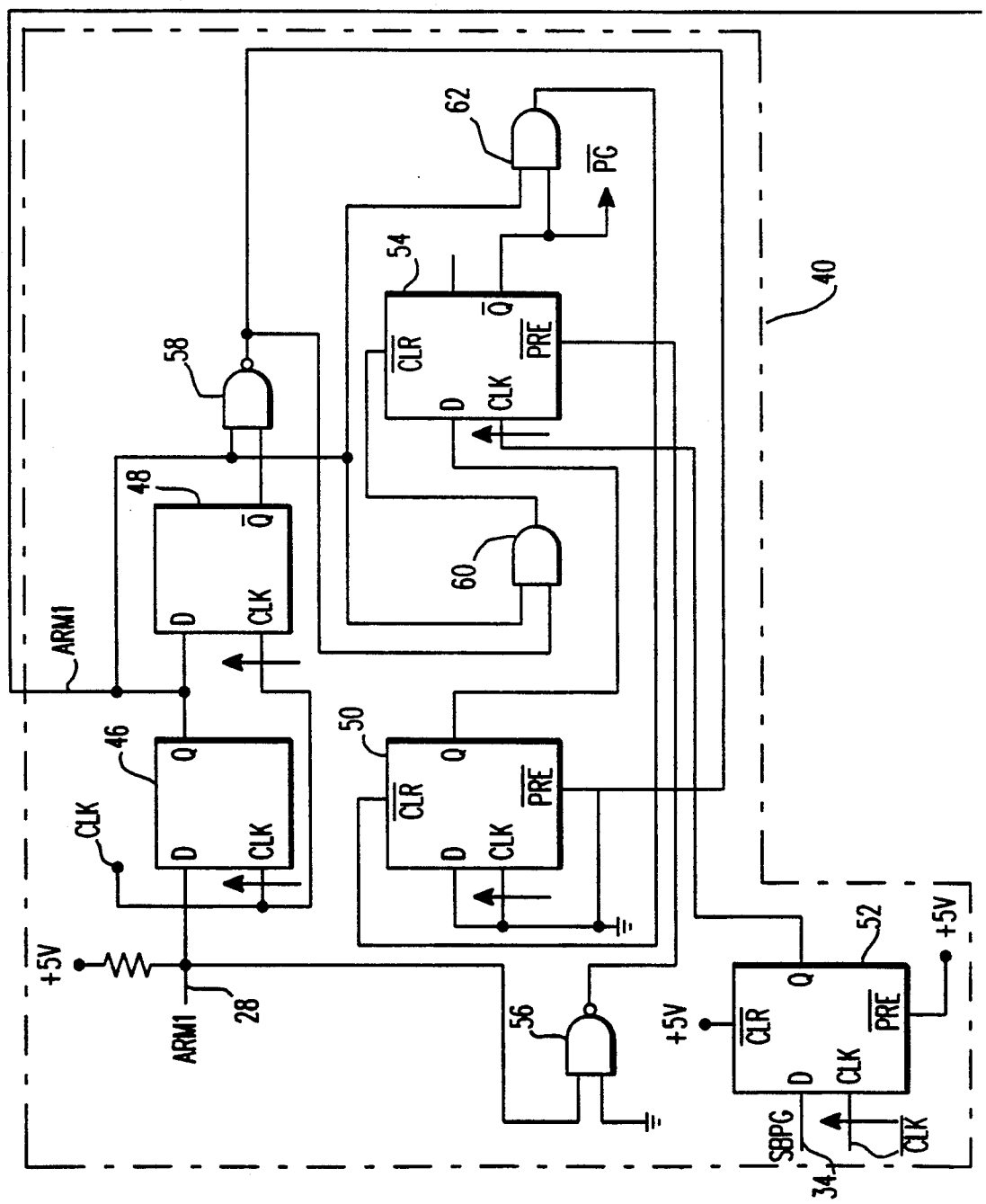
FIGS. 2A, 2B and 2C show a schematic diagram corresponding to the block diagram of FIG. 1.
Figure 2B:
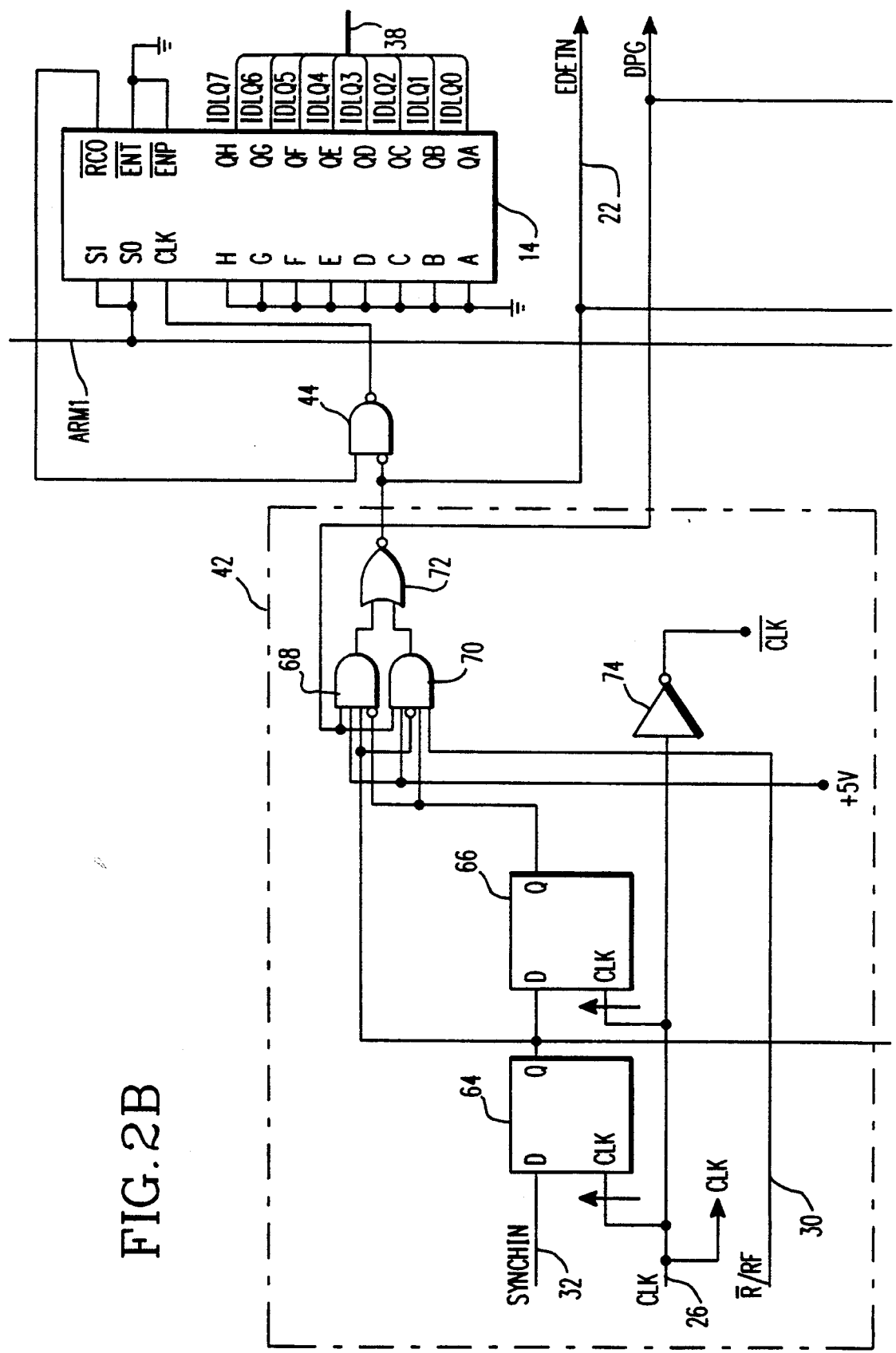
Figure 2C:
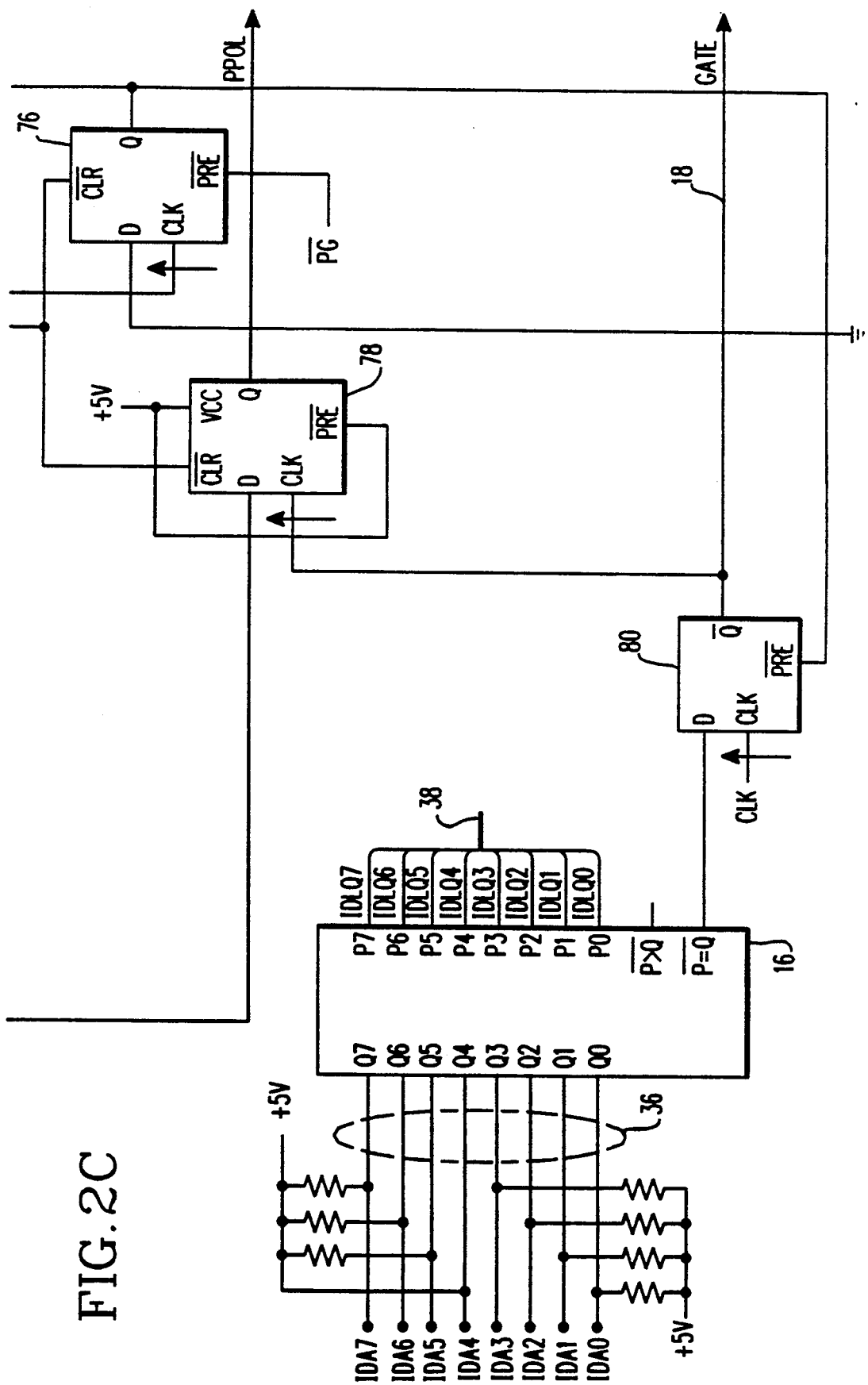

FIGS. 2A, 2B and 2C show a schematic diagram of a pulse width modulated waveform measurement circuit corresponding to the block diagram of FIG. 1. The edge detector portion of the circuit is shown to include an arm and period gate circuit 40, a state change detector circuit 42, and a counter overflow inhibit gate in the form of NAND gate 44. The arm and period gate circuit includes type D flipflops 46, 48, 50, 52 and 54; NAND gates 56 and 58; and AND gates 60 and 62 connected as shown in FIG. 2A. The state change detector circuit 42 includes type D flipflops 64 and 66; AND circuits 68 and 70; NOR circuit 72; and inverter 74. Type D flipflop 76 produces a period gate delay signal DPG and type D flipflop 78 produces a pulse polarity signal PPOL. Type D flipflop 80 serves as a pulse gate circuit which interfaces between pulse number comparator 16 and the output line 18.

As can be seen from FIGS. 1, 2A, 2B and 2C, the gate circuit 10 serves as an interface between the pulse width modulated input signal SYNCHIN and the timer 20 and produces a gate pulse signal GATE which corresponds to the width of the selected pulse of the pulse width modulated input signal for measurement. Once armed, transitions in signal SYNCHIN are first sensed by the edge detector 12. Each sensed transition increments the pulse counter 14. As the pulse counter is incremented, the pulse number comparator 16 outputs one gate pulse when the pulse count is equal to the pulse number determined by the inputs IDLA0 through IDLA7. The GATE output is equal in width to the desired pulse. This is then used as the gate input to timer 20. Microprocessor 24 can then acquire the selected pulse width by reading the count value output from timer 20 on data bus 82 in FIG. 1.

In FIG. 2A, flipflop 46 synchronizes signal ARM1 with the clock signal. When signal ARM1 is set to 0, the disable mode, the following takes place: (1) signals IDLQ0-IDLQ7 are all set to 0, and (2) signals GATE and PPOL are set to 0. When signal ARM1 is set to 1, the gate circuit becomes armed and transitions will be sensed on the SYNCHIN input after the first rising edge of signal SBPG. Only one GATE pulse is produced per cycle and signal ARM1 must be disabled and enabled for each additional measurement.

Signal PPOL indicates the polarity of the selected pulse of the gate input circuit. PPOL is 0 when the selected pulse is preceded by a high to low transition. PPOL is 1 when the selected pulse is preceded by a low to high transition. The eight output signals IDLQ0 through IDLQ7 represent the binary value of the total number of sensed transitions (defined by signal $\overline{R}$/RF) which has occurred on signal SYNCHIN during the duration of the acquisition cycle. This binary information is delivered to the microprocessor for comparison with a predetermined number representative of the desired operational status of the input pulse width modulated signal. The pulse polarity signal PPOL is also delivered to the microprocessor for comparison with a predetermined level.

Figure 3:
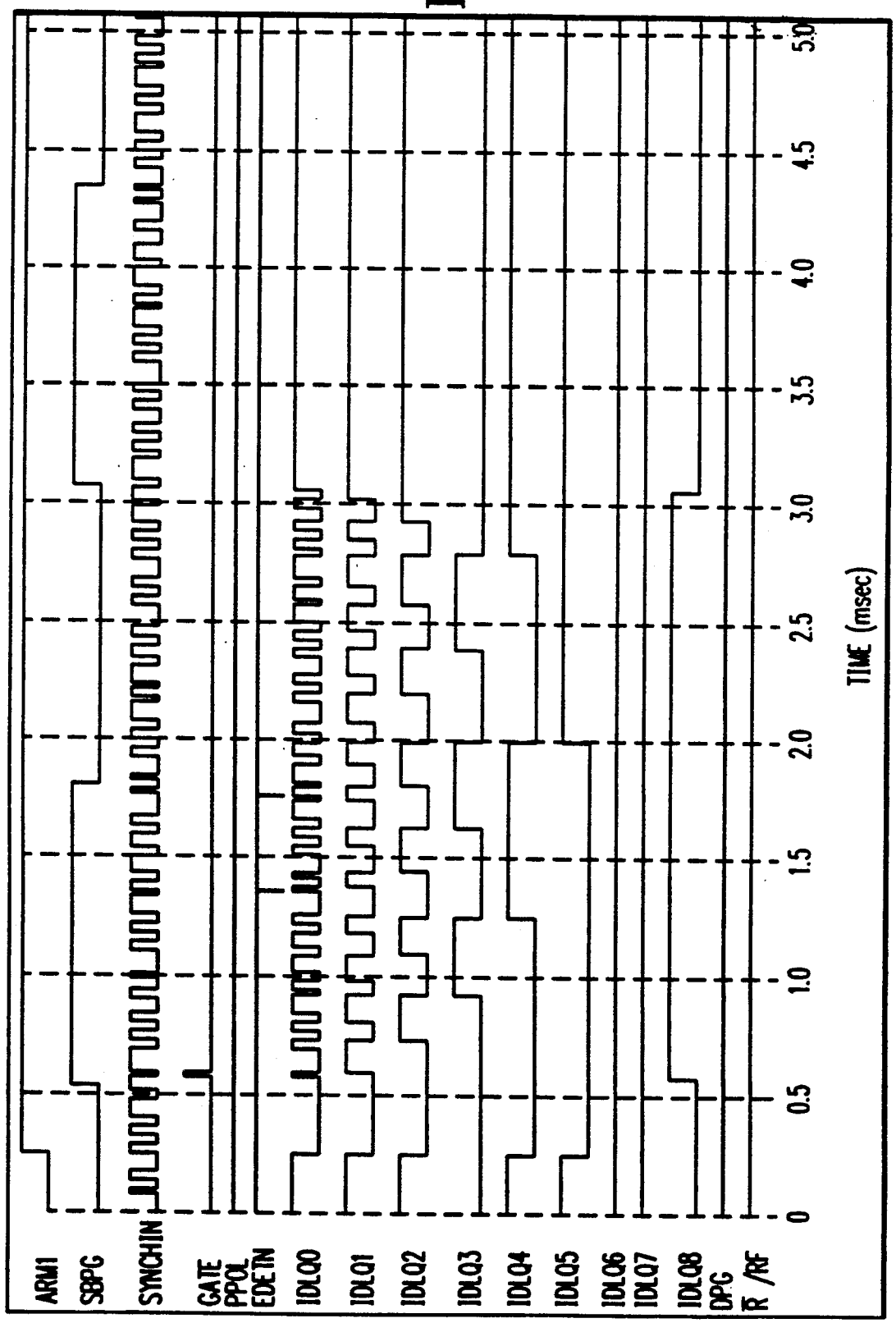
FIGS. 3–9 are a series of waveforms which illustrate the operation of the circuit of FIGS. 2A, 2B and 2C.
Figure 4:
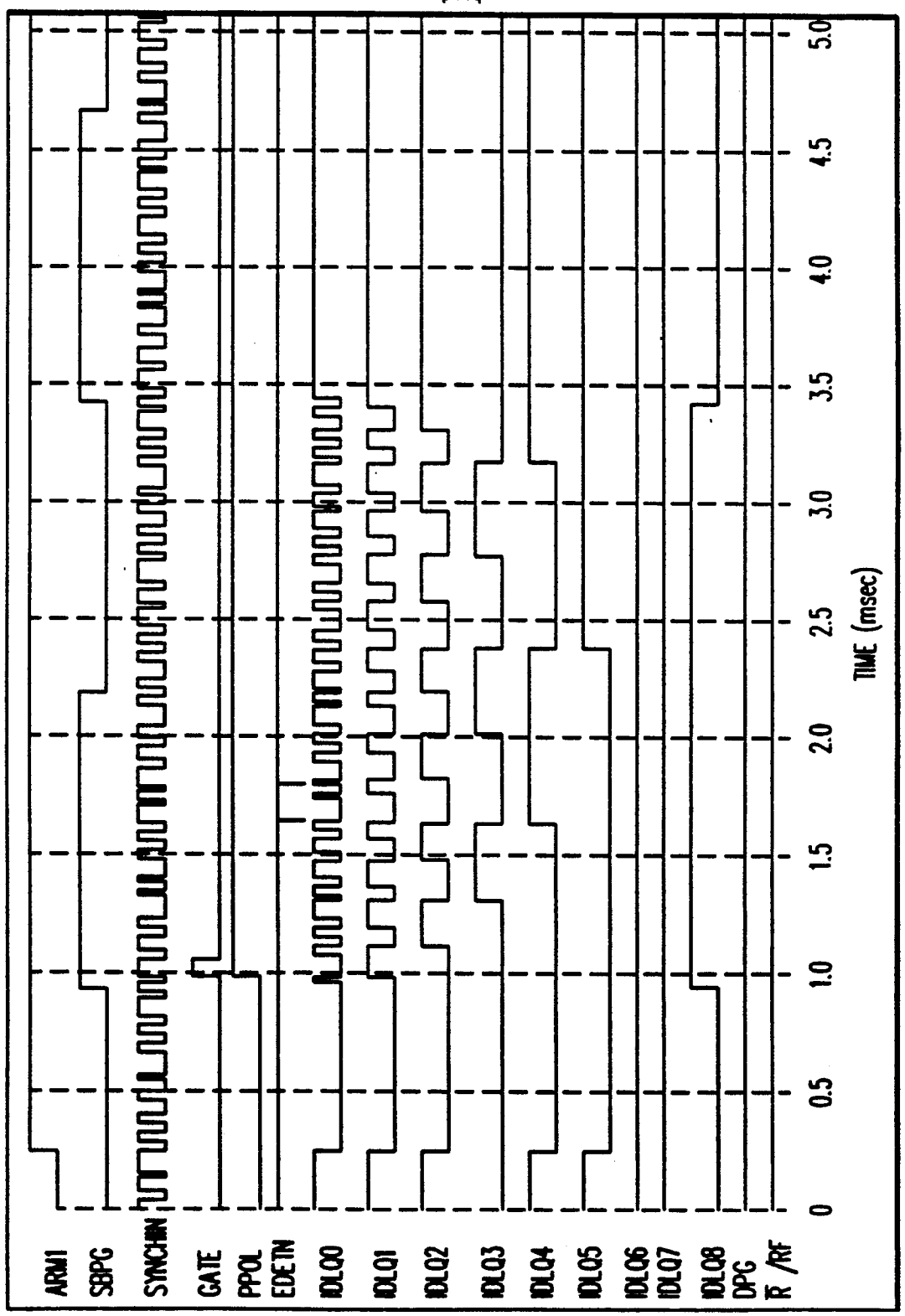
Figure 5:
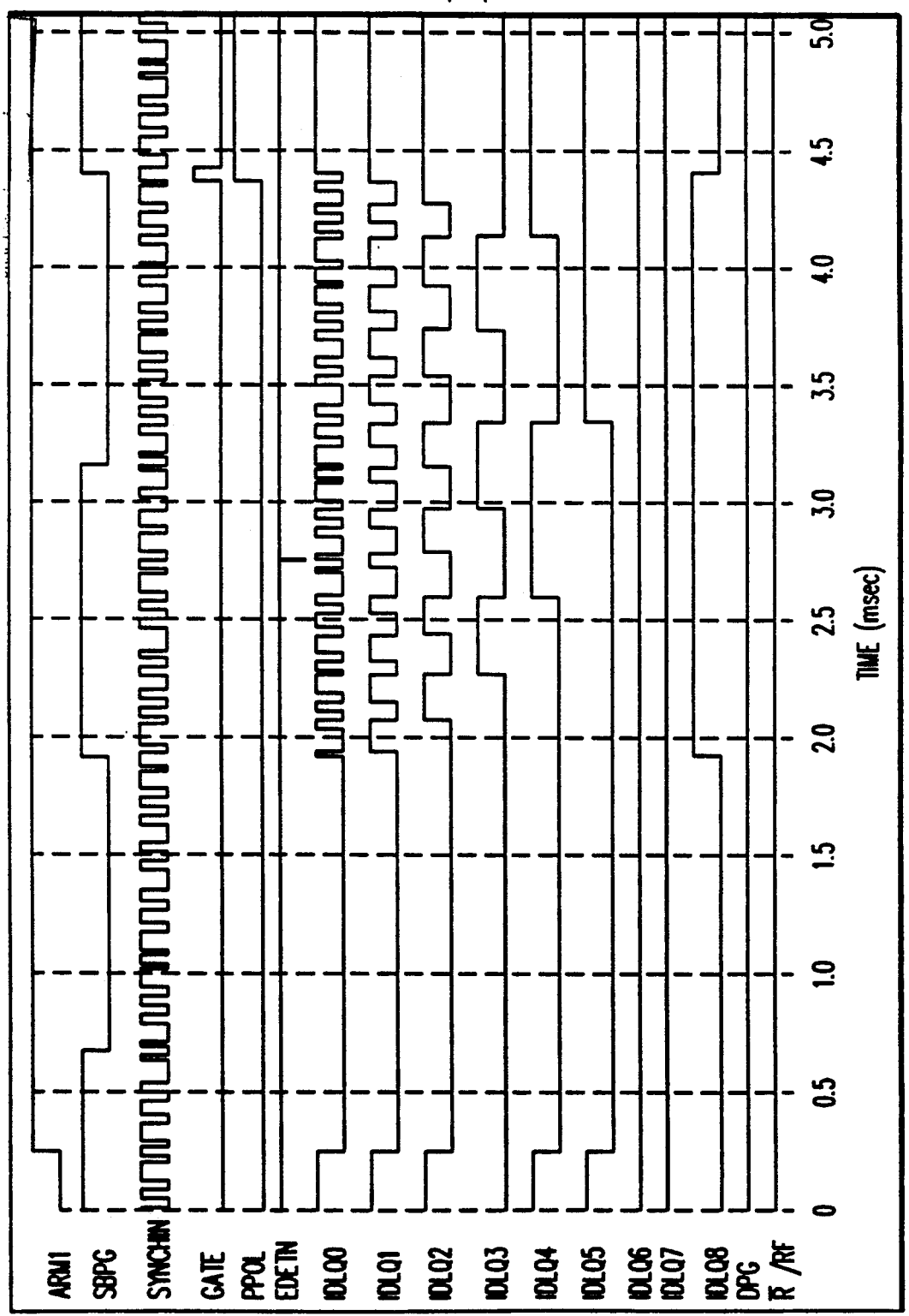

FIGS. 3 through 8 show a series of waveforms which illustrate the operation of the circuit of the FIGS. 1 and 2. A 54 pulse periodic waveform (rising and falling edges) was used as the SYNCHIN input signal. In the preferred application of this invention, this waveform is a composite signal representative of all of the switching device drive signals in an associated electronic inverter. FIGS. 3 through 5 show the operation of the circuit with signal $\overline{R}$/RF set to 1, programming the gate circuit to sense both rising and falling edges. FIG. 3 shows waveforms which illustrate the gate circuit output GATE acquiring the width of the first pulse in the input signal SYNCHIN. This is the first pulse of SYNCHIN after the gate circuit is armed by signal ARM1 and signal SBPG. The pulse polarity signal PPOL is 0.

FIG. 4 shows waveforms which illustrate the gate circuit output GATE acquiring the width of the second pulse and FIG. 5 shows waveforms which illustrate the circuit acquiring the last pulse number 54. Polarity signal PPOL is 1 in both cases. Note that at the end of either acquisition, signals IDLQ0 through IDLQ7 represent the decimal value 55, this represents the total edges which have occurred for the measurement cycle. The count produced by signals IDLQ0 through IDLQ7 is always one count more than the number of pulses which occurred in one measurement cycle.

Figure 6:
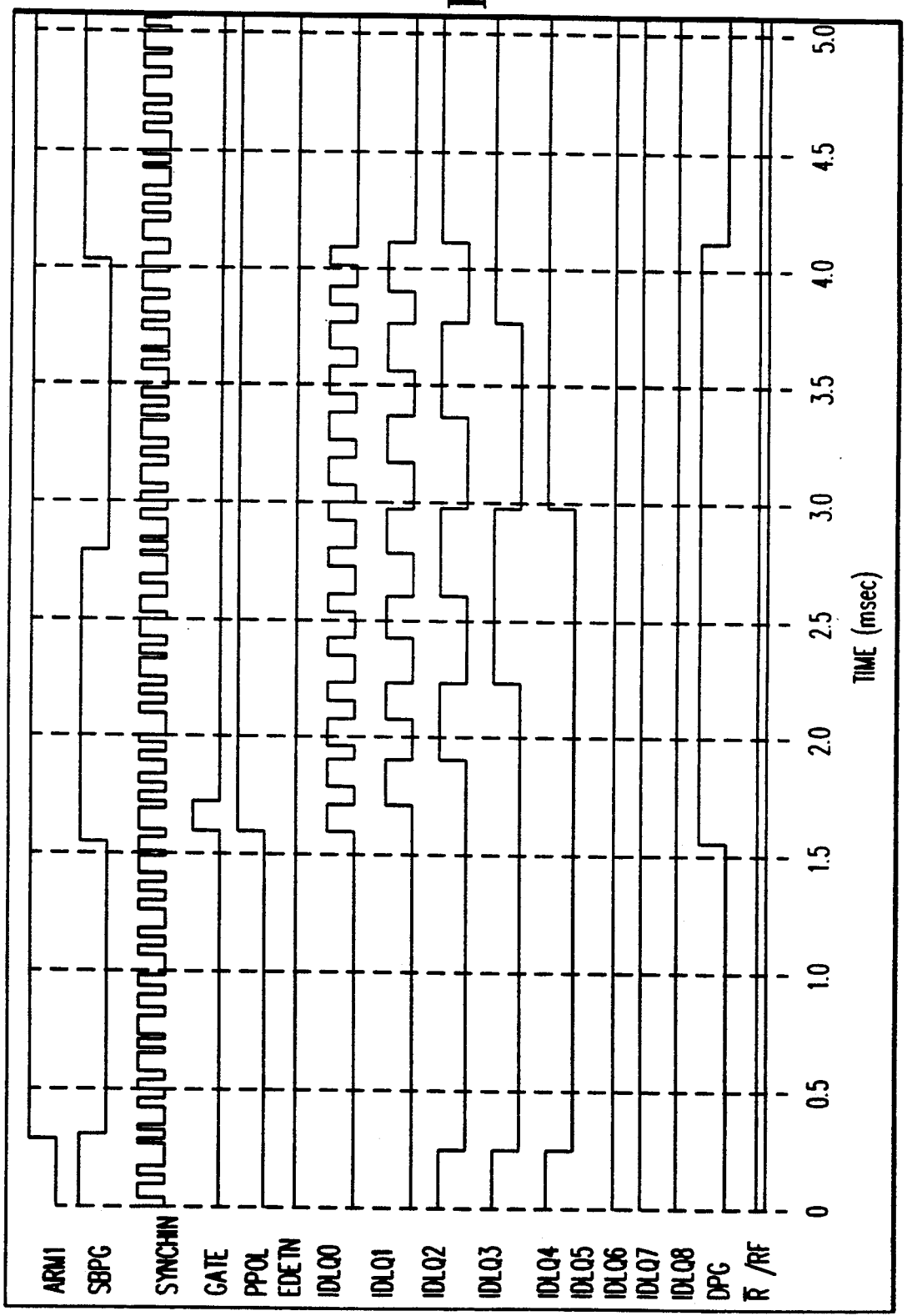
Figure 7:
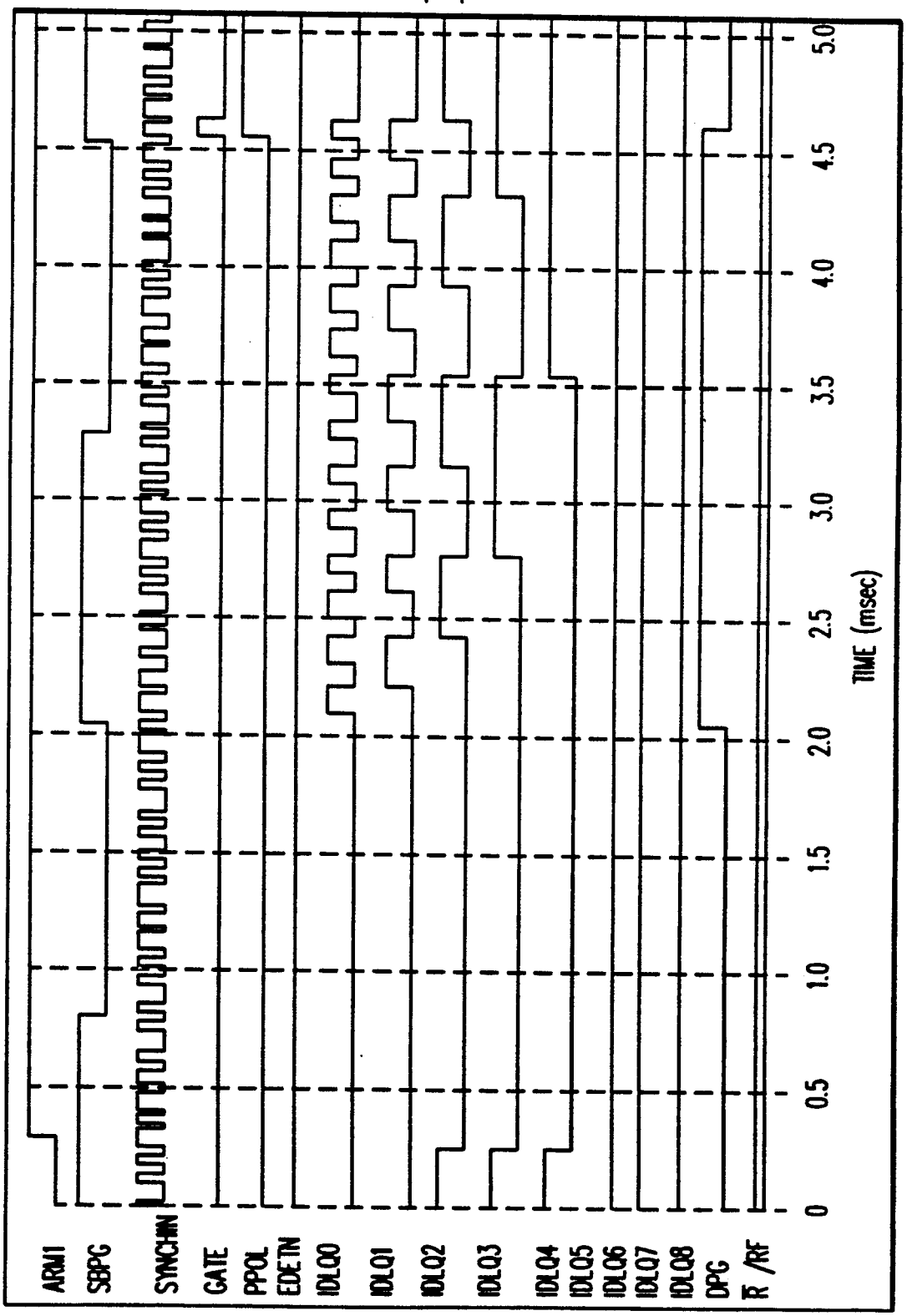

The waveforms of FIGS. 6 and 7 illustrate the operation of the circuit with signal $\overline{R}$/RF set to 0, thereby programming the gate circuit transition sensing for rising edges only. FIG. 6 illustrates the acquisition of pulse number 1 while FIG. 7 illustrates the acquisition of pulse number 27. Note that signals IDLQ0 through IDLQ7 represent the decimal value 28. This indicates that 27 pulse width modulated pulses have occurred and that corresponds to 54 input pulses divided by 2 since only half of the edges are being sensed.

Figure 8:
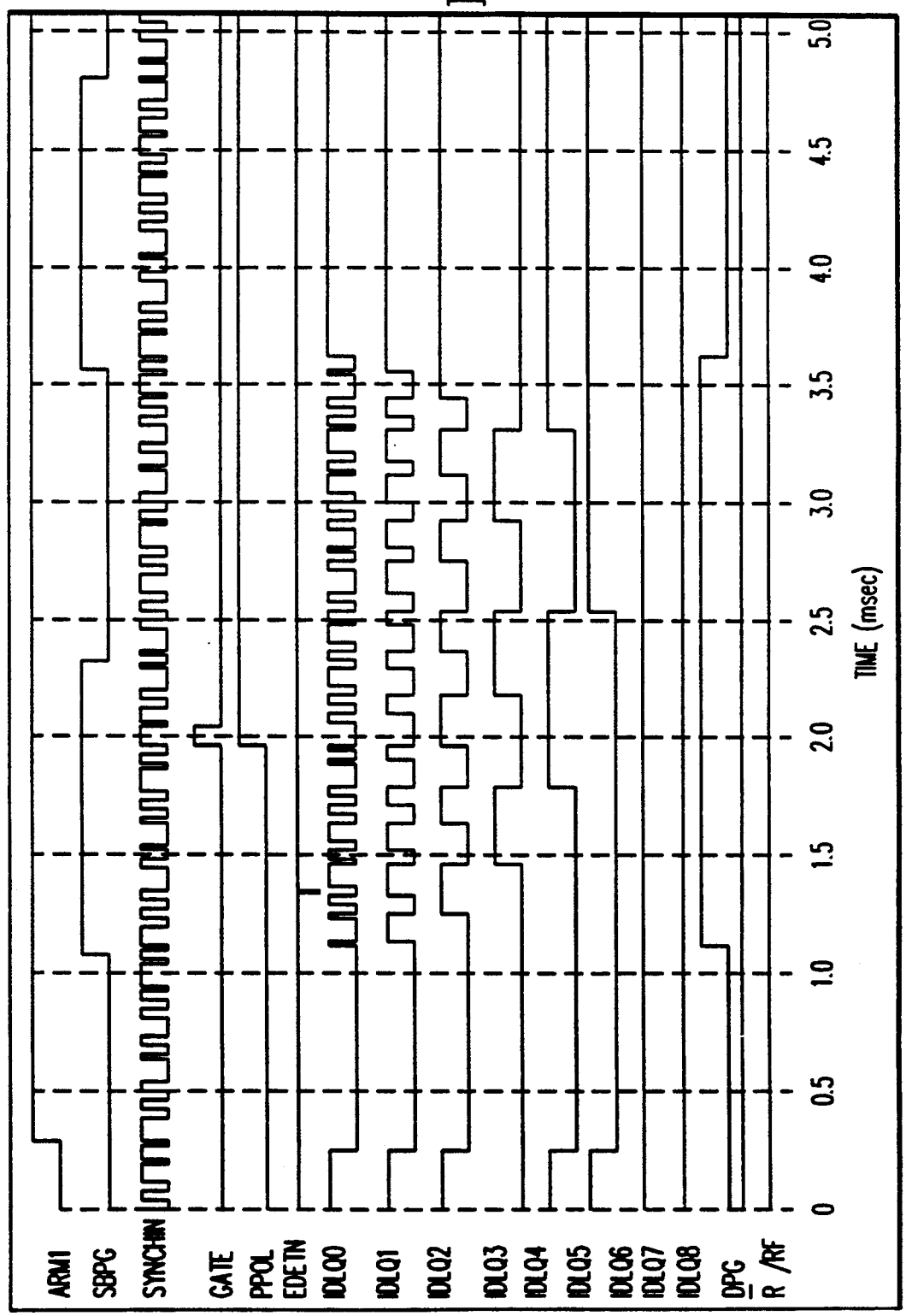
Figure 9:
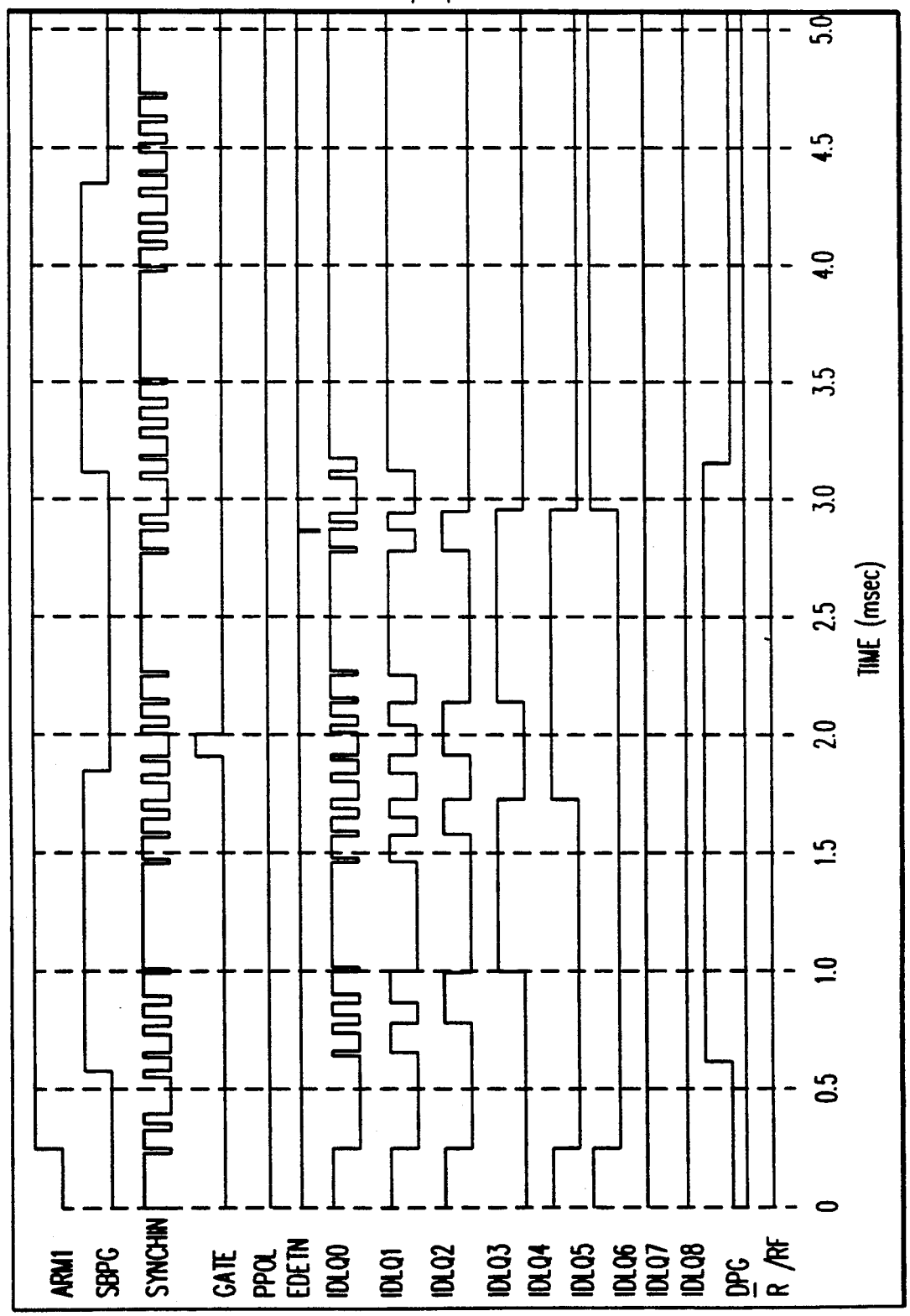

The waveforms of FIGS. 8 and 9 illustrate the operation of the circuit with signal $\overline{R}$/RF set for rising and falling edges. FIG. 8 illustrates the acquisition of pulse 20 of a normal 54 pulse periodic waveform. FIG. 9 illustrates what happens if acquisition for the same pulse number 20 is attempted on an abnormal waveform. The pulse width of signal GATE is approximately the same in FIGS. 8 and 9. However, signal PPOL is opposite polarity in the two figures and the decimal value of signals IDLQ0 and IDLQ7 is 35 in FIG. 9 versus the correct value of 55. Abnormal waveforms can therefore easily be detected when the microprocessor compares the measured number of total transitions during the measurement period with the predetermined number representative of the desired operation of the input waveform.

The circuit illustrated by FIGS. 2A, 2B and 2C can select any pulse up to a maximum of 255 pulses to be measured. It also totalizes the number of pulses during the measurement period and indicates the pulse polarity of the selected pulse. The type of sensed pulse width modulated input transition is programmable and the circuit is completely digital. Periodic pulse width modulated waveform measurement acquisitions are easily controlled and adapted to any pulse width modulated waveform pattern.

Figure 10:
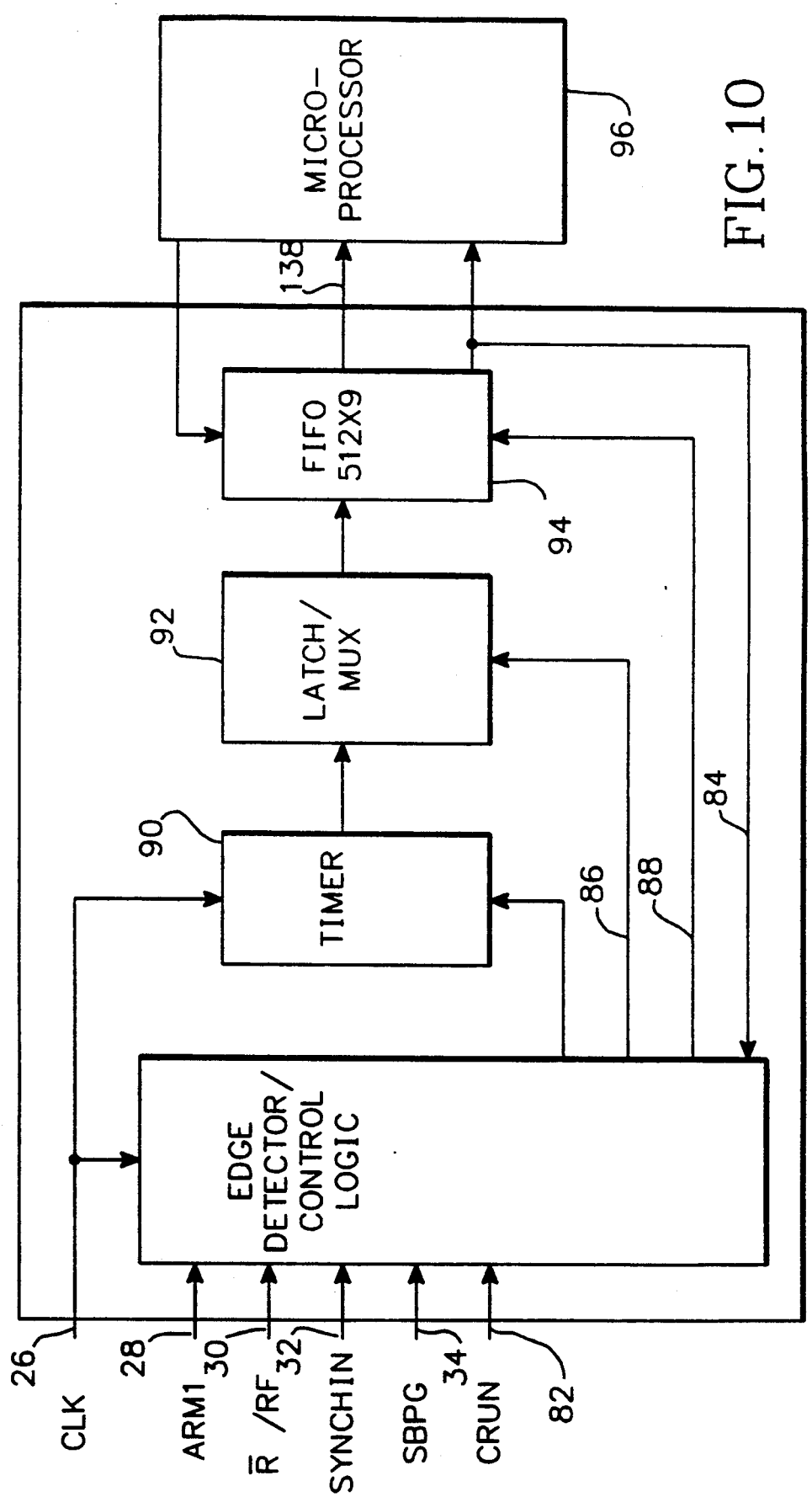
FIG. 10 is a block diagram of an alternative embodiment of the present invention.

Although the circuit described above can acquire each pulse width of an inverter drive periodic pulse width modulated waveform for self test and built in test functions, it is subject to certain limitations. In particular, it cannot acquire any pulse of a periodic pulse width modulated waveform which is greater than pulse number 255 during a particular measurement cycle. In addition, since it only acquires one pulse for each measurement period, the data represented by the other pulses is lost and a number of successive measurement periods must be conducted to measure each of the periodic pulses. FIG. 10 is a block diagram of a pulse width modulated waveform measurement circuit constructed in accordance with an alternative embodiment of the present invention which is capable of continuously acquiring each pulse in the pulse width modulated waveform in real time. The circuit includes an edge detector 12' which is similar to the edge detector 12 of FIG. 1 except that it includes two additional inputs 82 and 84 and two additional outputs 86 and 88. FIG. 10 also includes a 16 bit timer 90, a latch/multiplexer 92, a 512×9 high speed first-in first-out (FIFO) memory 94 and a microprocessor 96.

Figure 11A:
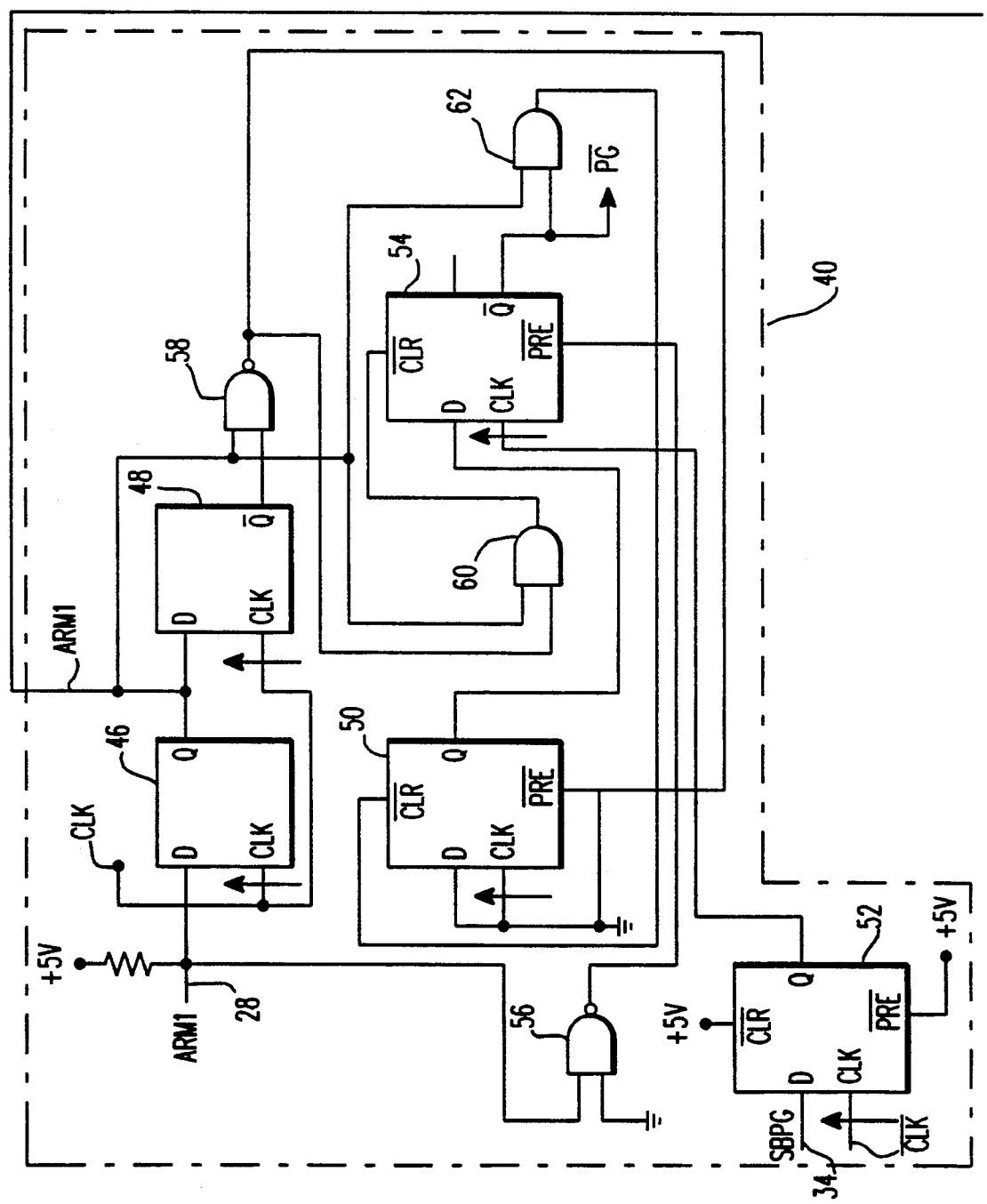
FIGS. 11A and 11B are is a schematic diagram of the edge detector and control logic portion of the block diagram of FIG. 10.
Figure 11B:
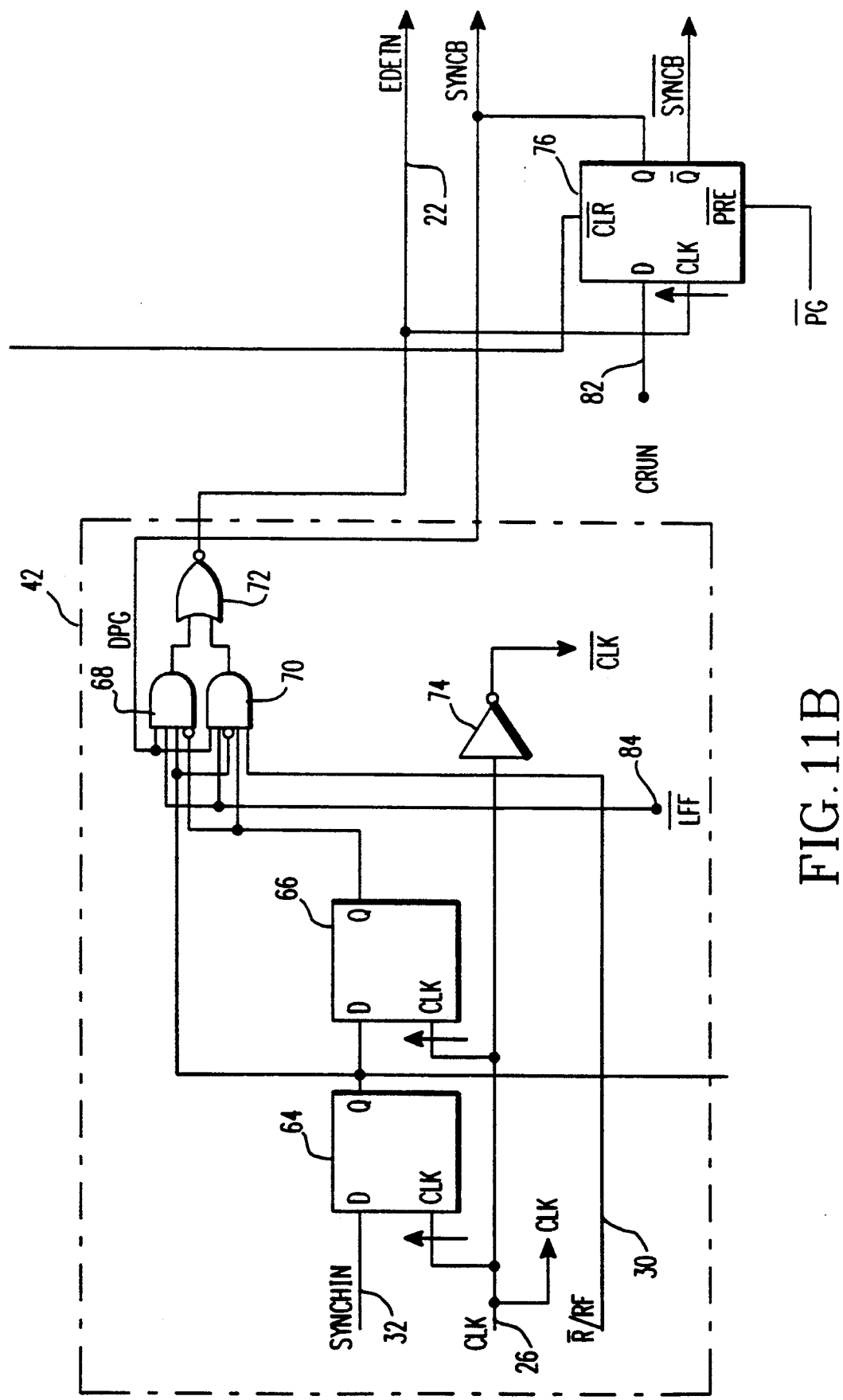

The edge detector and control logic circuits 40, 42 and flipflop 76 of FIGS. 11A and 11B are similar to the edge detector circuit of FIGS. 2A, 2B and 2C except for the addition of signals designated as CRUN and $\overline{LFF}$, as well as line identifying numbers 82, 84, 86 and 88, all of which will be discussed below. Similar identifying numbers in FIGS. 2A, 2B, 2C, 11A and 11B represent similar components.

Figure 12A:
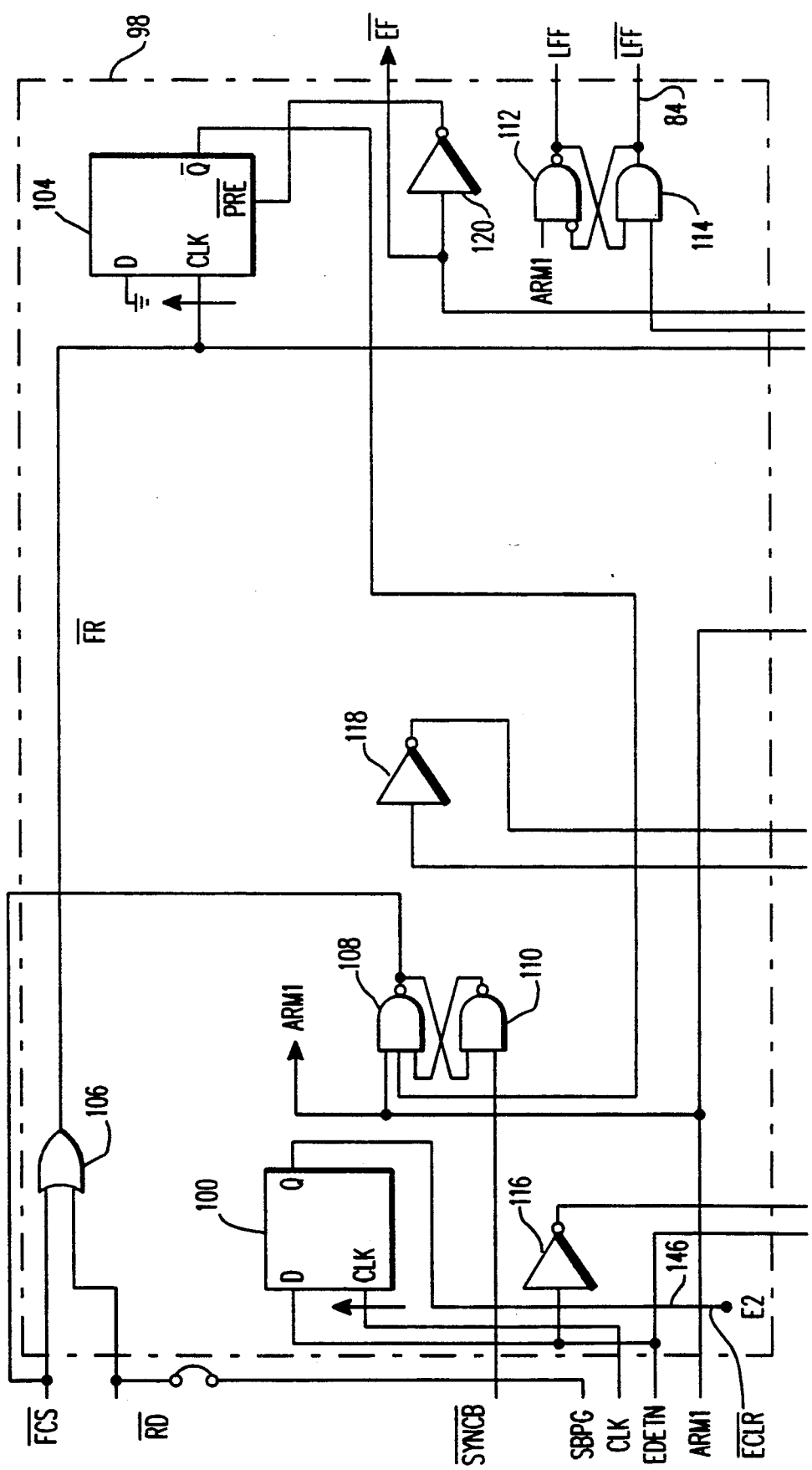
FIGS. 12A, 12B and 12C are a schematic diagram corresponding to portions of the block diagram of FIG. 10.
Figure 12B:
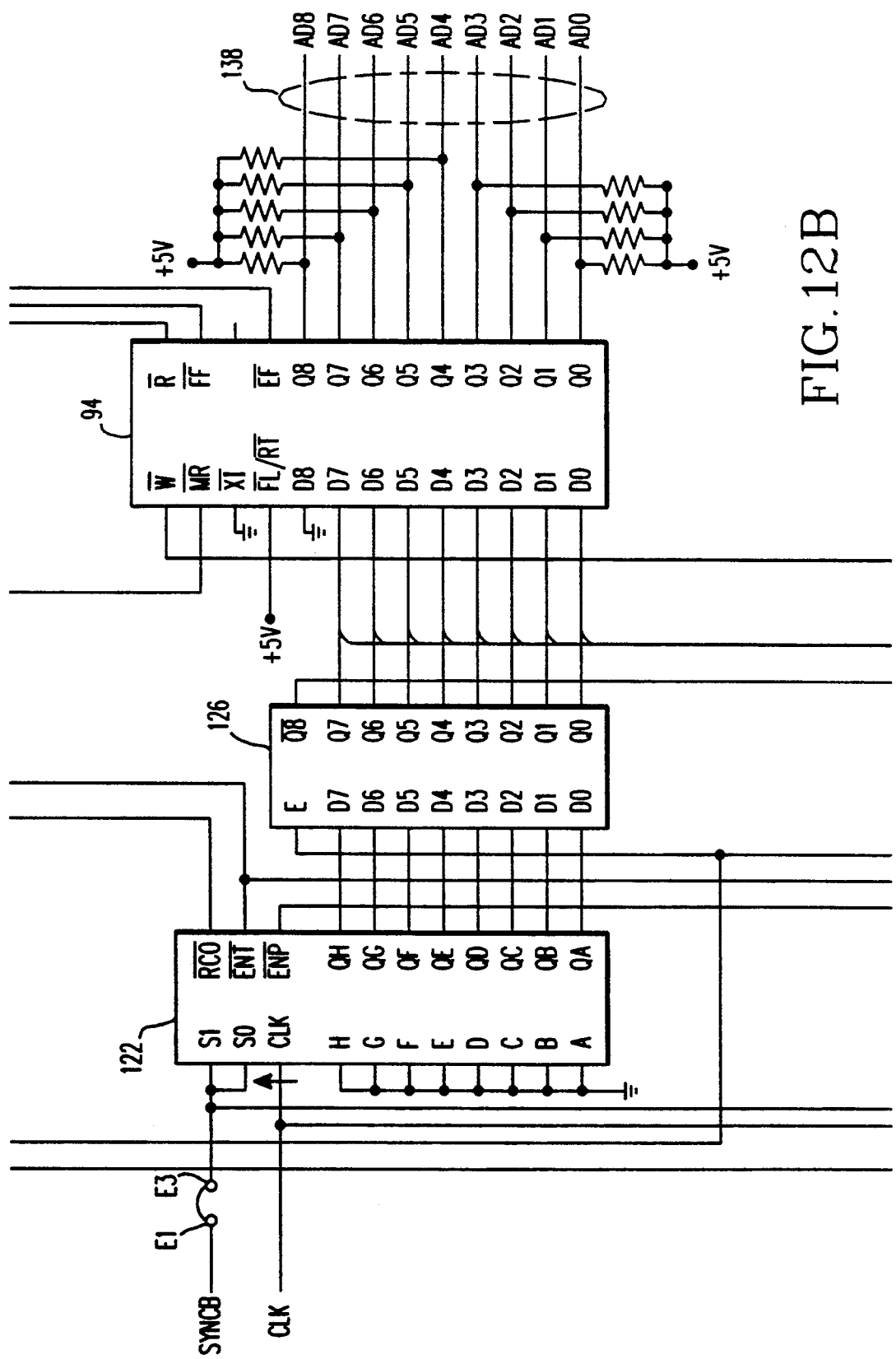
Figure 12C:
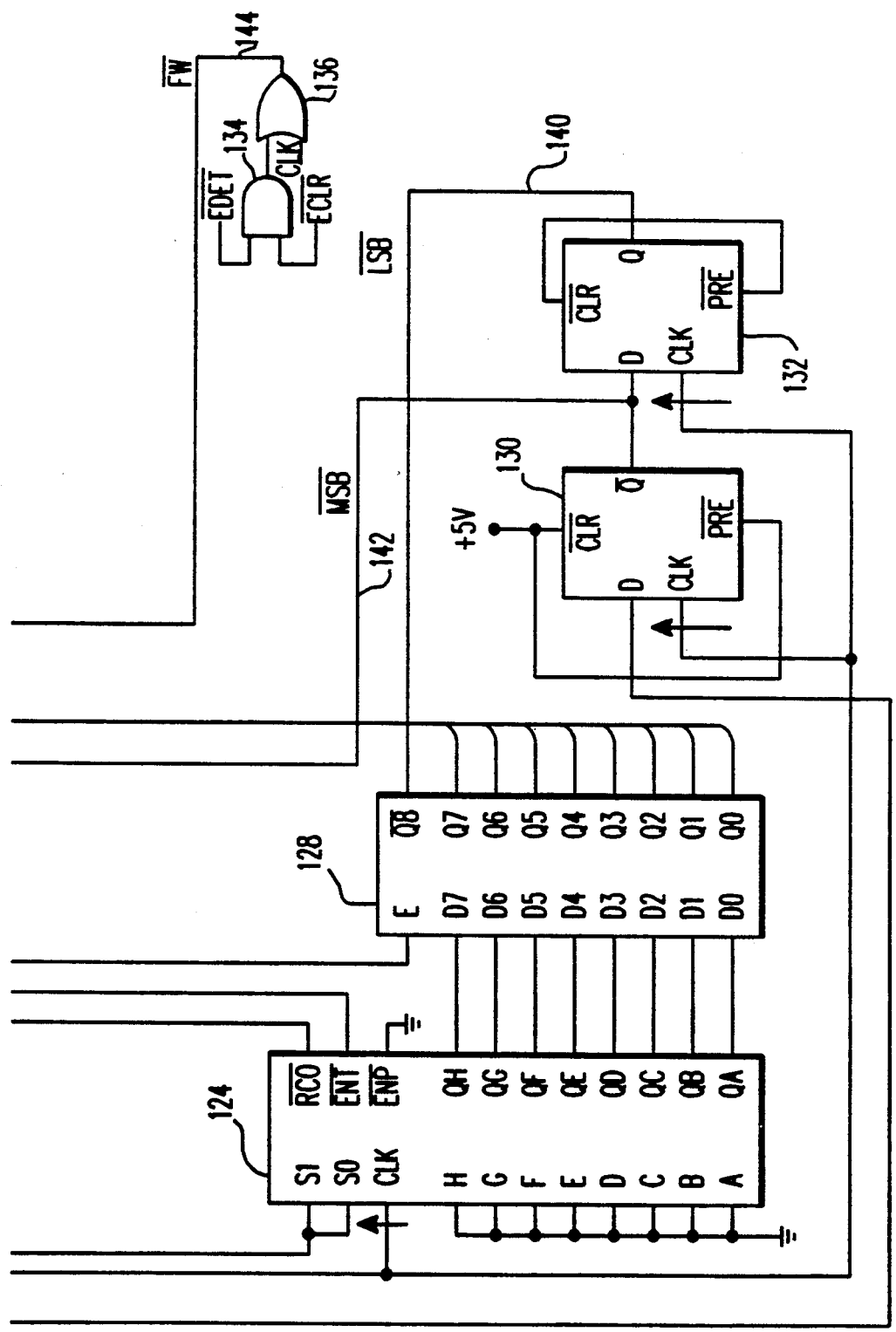

As shown in FIG. 12A, 12B and 12C, a control logic circuit 98 comprising type D flipflops 100 and 104; OR circuit 106; NAND circuits 108, 110 and 112; AND circuit 114; and inverters 116, 118 and 120, is used to control the operation of the latch/multiplexer and first-in first-out circuits of FIGS. 11A and 11B. The 16 bit timer 90 is shown in FIG. 12 as a pair of programmable counters 122 and 124. The latch/multiplexer 92 is seen to be comprised of circuits 126 and 128; type D flipflops 130 and 132; AND circuit 134; and OR circuit 136. The data bus output of the first-in first-out circuit is designated as item number 138. In the circuit of FIGS. 11A, 11B, 12A, 12B and 12C, transitions in the SYNCHIN signal are first sensed by the edge detector of FIG. 11B which in turn generates signal EDETN. This signal pulses low for one clock cycle each time an input transition is sensed and is used to latch the value in the 16 bit timer 90 in the latch/multiplexer circuit 92. Next, two FIFO write cycles are generated in which the latched 16 bit timer data is written to the FIFO in two consecutive 8 bit bytes, the most significant byte (MSB) is written first then the least significant byte (LSB) is written. This is accomplished by the control logic circuit 98 and signals $\overline{LSB}$, $\overline{MSB}$ and $\overline{FW}$ on lines 140, 142 and 144 respectively. The microprocessor periodically empties the FIFO by consecutively reading its contents until signal $\overline{EF}$ is low, signaling that the FIFO is empty. The microprocessor then compares the stored pulse width data with appropriate predetermined data to determine the operational status of the input signal.

The timer 90 in FIG. 10 can operate in two different modes. If signal $\overline{ECLR}$ on line 146 is used for timer reset by connecting terminals E2 and E3, the timer is reset each time the FIFO data is latched by the latch/multiplexer. The stored timer data directly represents the pulse width of a pulse in the pulse width modulated input signal. A second timer mode lets the timer free run after the start of the acquisition cycle by using signal SYNCB for timer reset. This is accomplished by connected terminals E1 and E3. In this case, each pulse width of the input pulse width modulated waveform is now easily calculated by the following equation:

Pulse Width (n)=FIFO(2n+1, 2n+2)−FIFO(2n−1, 2n)

Where:
Pulse width is represented as an integer number of timer clock cycles, and FIFO (x) is the xth byte stored in the FIFO.

As an example, the first pulse width would be calculated as FIFO(3)FIFO(4)—FIFO(1)FIFO(2). The second would be FIFO(5)FIFO(6)—FIFO(3)FIFO(4), and so on.

In the continuous mode, the FIFO can be continuously written without data loss as long as the microprocessor reads (empties) the FIFO at an average rate equal to or greater than the rate at which the FIFO is written.

The input and output signals illustrated in FIGS. 11A, 11B, 12A, 12B and 12C can now be further defined. The ARM1 input signal is used to initialize the inverter drive logic first-in first-out built-in test circuit and to initiate a pulse width measurement acquisition cycle. When signal ARM1 is set to the disable mode, the following takes place: (1) all FIFO stored data is cleared; (2) no input transitions are sensed; and (3) any acquisition already in progress is terminated. When ARM1 is set to 1, the gate circuit becomes armed and transitions will be sensed on the SYNCHIN input after the rising edge of signal SBPG. Signal ARM1 must be disabled and enabled for each additional periodic acquisition cycle.

The $\overline{R}/RF$, SYNCHIN, SBPG, and CLK inputs all function as previously described for the circuit of FIGS. 2A, 2B and 2C. The CRUN input signal is used to program the operating acquisition mode of the circuit. If CRUN is low, the periodic acquisition mode is selected. If CRUN is high, the continuous acquisition mode is selected. Signals AD0 through AD7 in bus 138 represent the 8 bit output of the FIFO which is directly connected to the address/data bus of the microprocessor. The microprocessor can consecutively read from the FIFO at a data rate which is determined by the speed of the particular FIFO. Output signal $\overline{EF}$ is the FIFO empty flag. The read cycle before an empty FIFO condition occurs triggers a high to low transition of output signal $\overline{EF}$. This signal is read by the microprocessor and is used to verify that the FIFO has been cleared. In addition, it is used to indicate if any FIFO data has been written during an acquisition cycle.

Output signal $\overline{LFF}$ is a full flag (NOT) signal from the FIFO which is latched during an acquisition cycle (ARM1 is high). Signal $\overline{LFF}$ goes low during the FIFO write cycle in which the last available location in the FIFO is written and remains latched until signal ARM1 is set low in preparation for the next acquisition cycle. This signal is read by the microprocessor to verify that the FIFO memory has not run out during any acquisition cycle. In addition, it is used by the edge detector to inhibit any further sensed transitions and consequently any FIFO data write operations. This is necessary since any data from the FIFO read after the full condition would free up another location and non-successive data will then be written causing indeterminate results.

Figure 13:
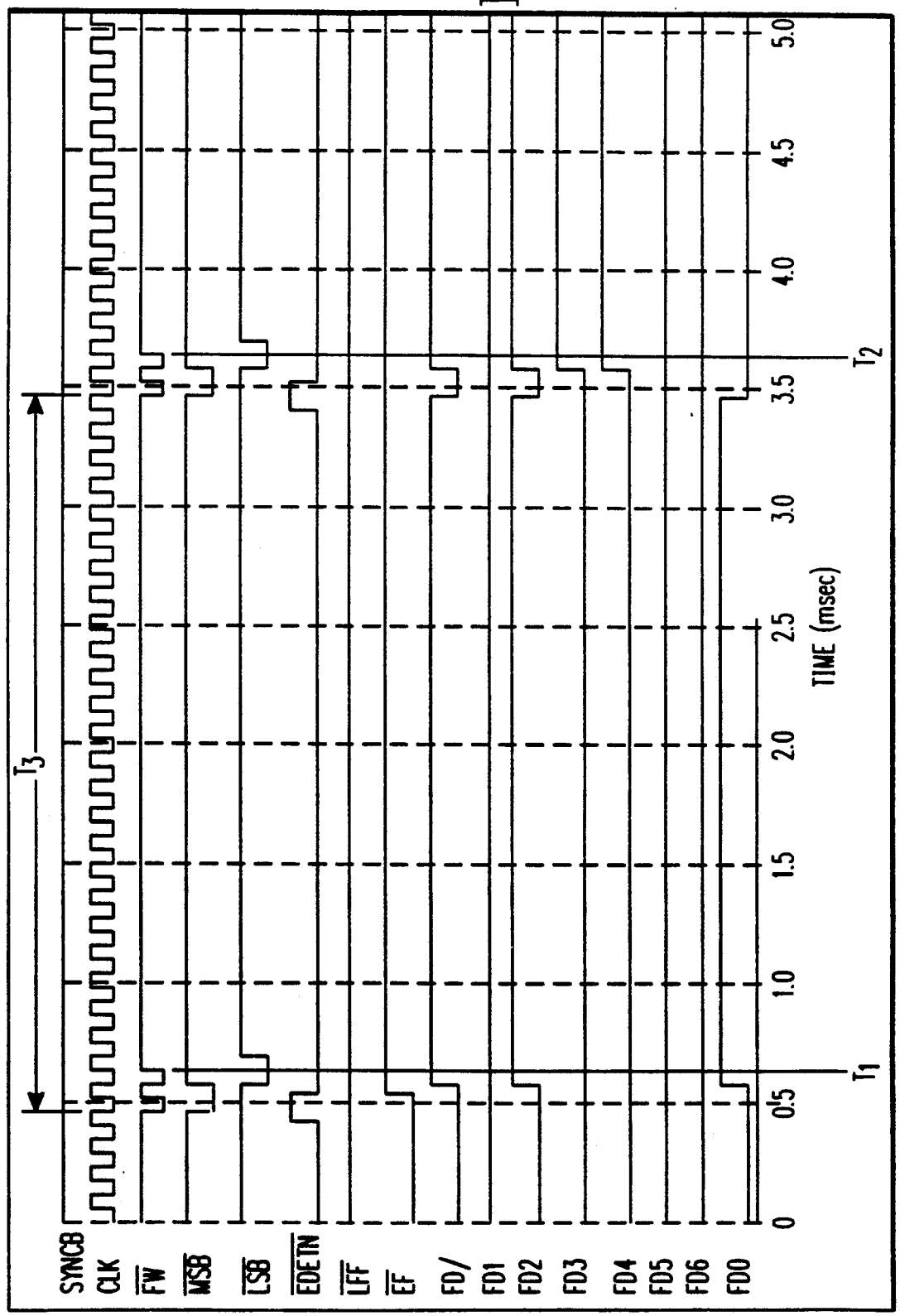
FIGS. 13, 14A, 14B, and 15 are a series of waveforms which illustrate the operation of the circuit of FIGS. 10, 11A, 11B, 12A and 12B.

FIGS. 13, 14A, 14B and 15 are a series of waveforms which illustrate the operation of the circuits of FIGS. 11A, 11B, 12A, 12B and 12C. FIG. 13 is a timing diagram showing two consecutive first in first out write cycles. The data is stored in the FIFO on the rising edge of signal FW. As can be seen from the waveforms, 0085H is written at time T1 and 009CH is written at time T2. The pulse width in integer clock cycles is then 009CH minus 0085H which is 17H for 23 clock cycles. This corresponds to the number of clock cycles (falling edges) which occur during the timer period T3.

Figure 14A:
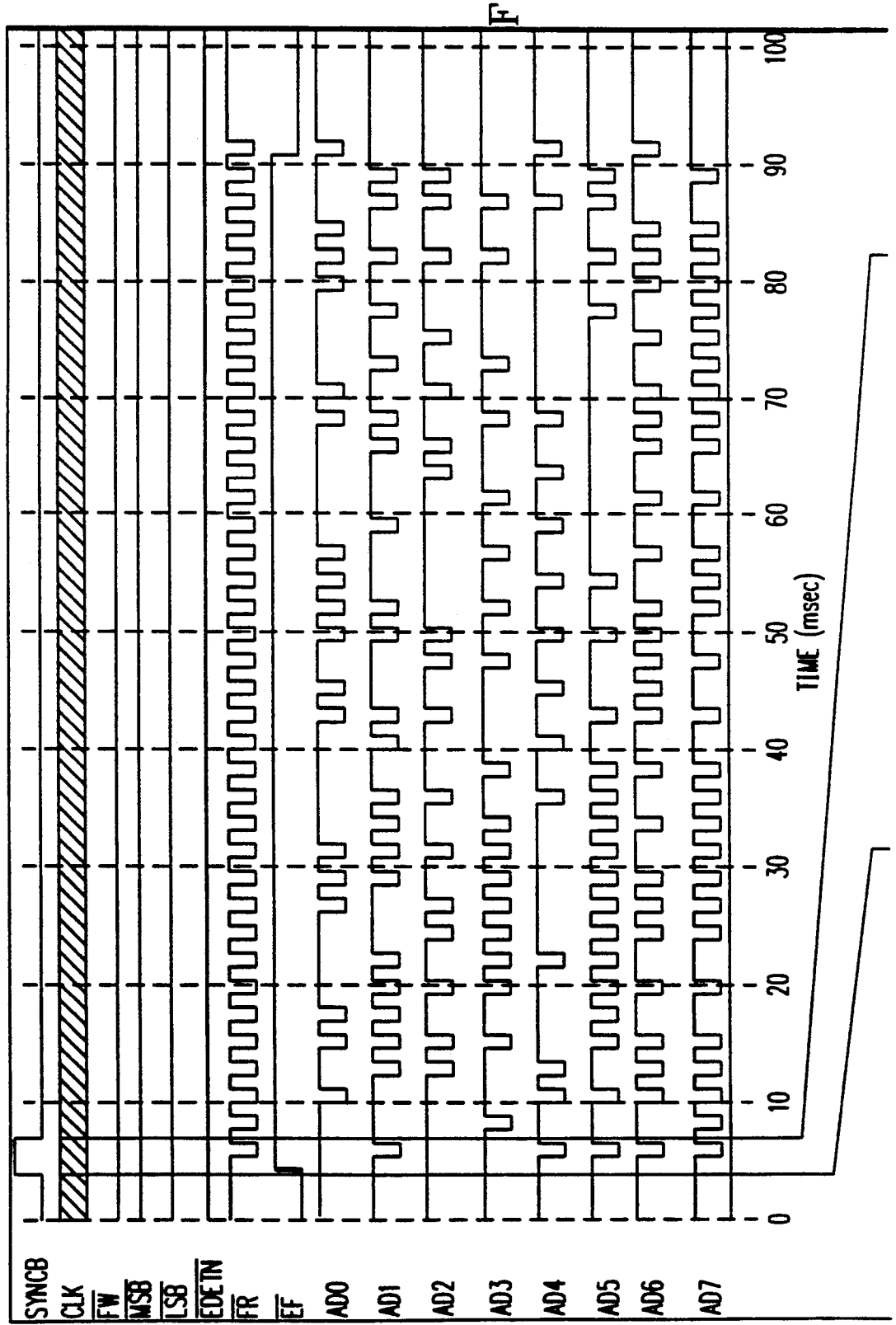
Figure 14B:
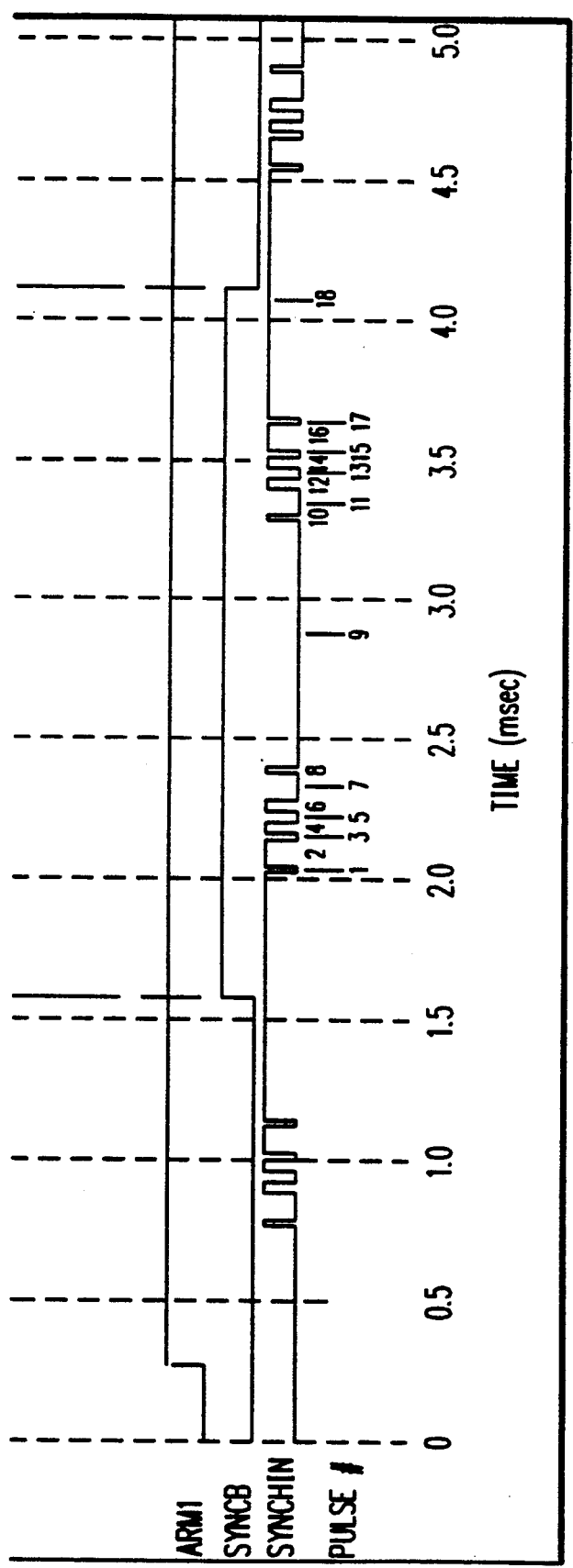

FIGS. 14A AND 14B are is a timing diagram showing FIFO data for the periodic acquisition of the inverter drive logic built-in test pulse width modulated signal BPHA. This is an 18 pulse waveform which is acquired while signal SYNCB is high. The timer is set for the periodic acquisition mode during this acquisition. The FIFO is consecutively read at one byte for each 2.5 milliseconds, this occurs each time signal $\overline{FR}$ is low. There are a total of 38 bytes of data stored in the FIFO. After all data is read, signal $\overline{EF}$ is low and inhibits further readings. The 38 bytes correspond to 19 timer events, two bytes for each 16 bit event. These 19 events mark the transitions of the 18 pulse waveform. Pulse widths of the input pulse width modulated BPHA signal can be derived from this stored FIFO data.

As an overall check, the total clock pulses for all 18 input waveform pulses should be the clock cycles per second multiplied by the acquisition time, which in one embodiment is 19,512 clock cycles. The actual FIFO data is 22,958 minus 3,447, which equals 19,511 clock cycles. This is one clock cycle less than theoretical, well within the limits of accuracy for the circuit.

Figure 15:
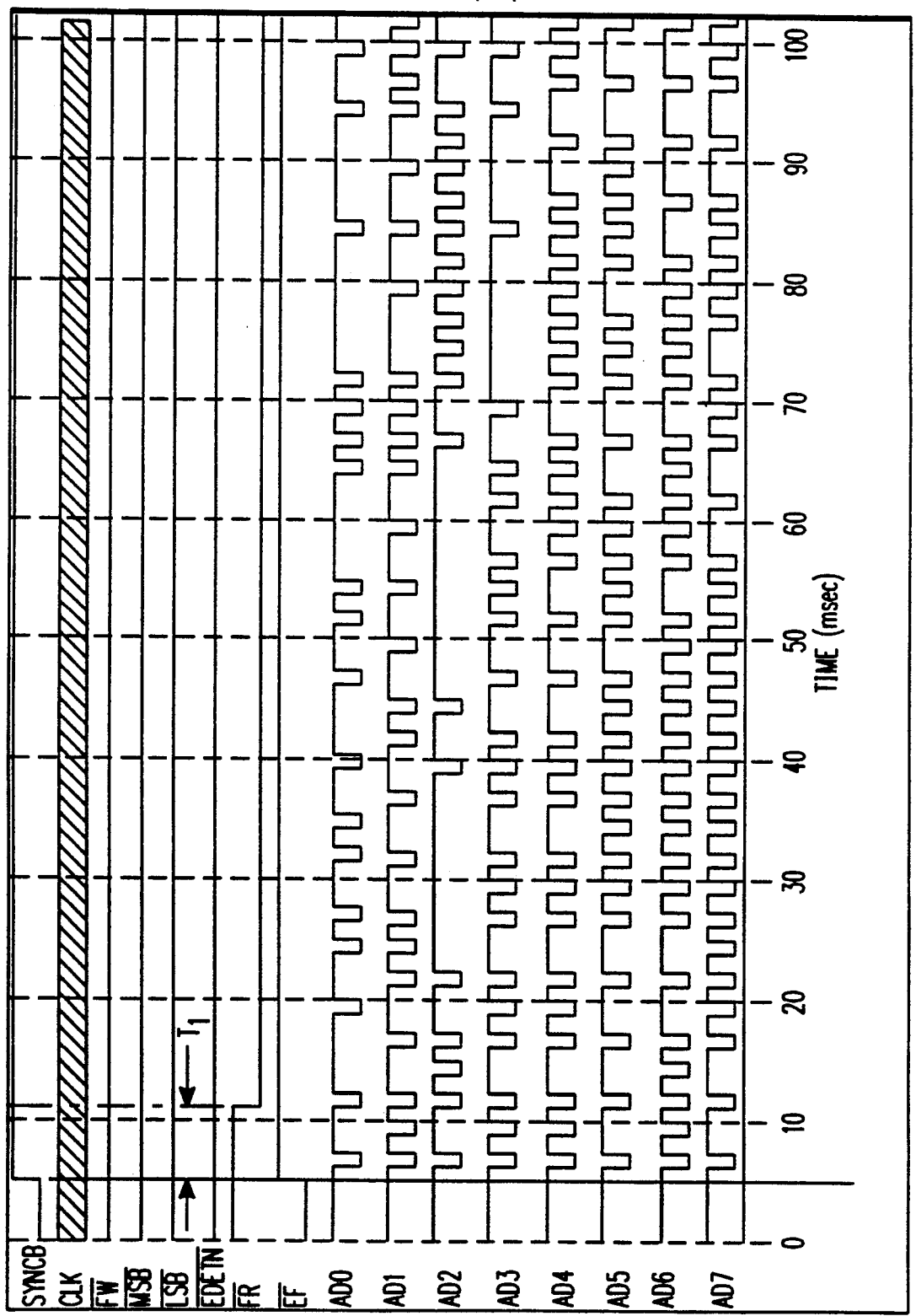

FIG. 15 shows the waveform diagrams for the FIFO full condition for continuous mode acquisition of the inverter drive logic built-in test waveform BIT2 (108 pulses each 2.5 milliseconds). A full FIFO condition is induced by making the FIFO write data rate, 86.4 kilobytes per second, much greater than the read data rate of 0.4 kilobytes per second. Time T1 of FIG. 15 indicates the time it takes to fill the FIFO (approximately 6 milliseconds) which corresponds to the theoretical value of 5.9 milliseconds.

Transitions of the pulse width modulated input signal are sensed only during T1 since signal $\overline{LFF}$ inhibits such transitions. No further data is written into the FIFO. At a FIFO read data rate of one byte, each 2.5 milliseconds, it takes approximately 1.3 seconds to empty the FIFO. Therefore, about 520 bytes were stored which corresponds closely to the total FIFO memory of 512 bytes. If signal $\overline{LFF}$ did not inhibit sense transitions of the pulse width modulated input, the FIFO would never be able to be emptied and retrieval of the correct FIFO data would not be possible for the continuous mode.

The circuit of FIGS. 11A, 11B, 12A, 12B and 12C can continuously acquire each pulse of a pulse width modulated waveform by sensing either rising or rising and falling edges. Any number of pulses per period can be acquired. It can also be programmed to operate in a periodic or continuous acquisition mode.

The circuit of FIGS. 1, 2A, 2B and 2C performs a pulse width modulated waveform measurement method which includes the steps of detecting logic level transitions in a pulse width modulated waveform during a measurement interval, counting clock pulses, and enabling such counting during a time period corresponding to the width of a preselected pulse in the pulse width modulated waveform. The polarity of the selected pulse is also acquired. The output count is compared with a predetermined count; the number of logic level transitions in the pulse width modulated waveform during the measurement interval is compared with a predetermined number; and the pulse polarity is compared with a predetermined level; to obtain an indication of the operational status of the pulse width modulated waveform.

The circuits of FIGS. 10, 11A, 11B, 12A, 12B and 12C perform a pulse width modulated waveform measurement method which includes the steps of detecting logic level transitions in a pulse width modulated waveform during a measurement interval, counting clock pulses, and resetting the counter after a time period corresponding to the widths of successive pulses in the pulse width modulated waveform. All successive output counts are stored in real time wherein each of the output counts corresponds to the width of one of the successive pulses. At least a portion of each of the output counts is successively compared with one of a plurality of predetermined counts to obtain an indication of the operational status of the pulse width modulated waveform.

Although the present invention has been described in terms of its preferred embodiments, it will be apparent to those skilled in the art that various changes will be made without departing from the scope of the invention. It is therefore intended that the appended claims cover such changes.

I claim:

1. A pulse width modulated waveform measurement circuit comprising:
   means for generating output signals corresponding to logic level transitions in a pulse width modulated waveform during a measurement interval;
   means responsive to said output signals of said means for generating for counting the number of logic level transitions which occur during said measurement interval;
   a first counter for counting clock pulses;
   means responsive to said output signals of said means for generating for enabling said counter to count said clock pulses during a time period between two of said logic level transitions, said time period corresponding to a width of a preselected pulse occurring during said measurement interval in said pulse width modulated waveform; and means for comparing an output count from said counter with a predetermined count and for comparing the number of said logic level transitions in said pulse width modulated waveform during said measurement interval with a predetermined number to obtain an operational status indication of said pulse width modulated waveform.

2. A pulse width modulated waveform measurement circuit as recited in claim 1, further comprising:

means responsive to said output signals of said means for generating for producing a polarity signal representative of a logic level of said preselected pulse, said polarity signal being used by said means for comparing to obtain said operational status indication of said pulse width modulated waveform.

3. A pulse width modulated waveform measurement circuit as recited in claim 1, wherein:

said means for generating only generates said output signals in response to rising edges of said pulse width modulated waveform.

4. A pulse width modulated waveform measurement circuit as recited in claim 1, wherein:

said means for generating generates output signals in response to both the rising and falling edges of said pulse width modulated waveform.

5. A pulse width modulated waveform measurement circuit as recited in claim 1, wherein:

said pulse width modulated waveform is a composite signal representative of inverter drive logic signals in an electronic inverter.

6. A pulse width modulated waveform measurement circuit as recited in claim 1, wherein means for enabling said counter comprises:

a gate circuit for producing a gate pulse having a width corresponding to the width of said selected pulse in said pulse width modulated signal occurring during said measurement interval.

7. A pulse width modulated waveform measurement circuit as recited in claim 6, wherein said gate circuit comprises:

a second counter responsive to said output signals received from said means for generating for counting said logic level transitions in said pulse width modulated waveform; and a comparator for comparing an output signal from said second counter with a preselected input count and for generating said gate signal in response to a coincidence between said output signal from said second comparator and said preselected input count.

8. A pulse width modulated waveform measurement method comprising the steps of:

generating output signals corresponding to logic level transitions in a pulse width modulated waveform that occur during a measurement interval;

counting said logic level transition output signals to determine the number of logic level transitions occurring in said pulse width modulated waveform during said measurement interval;

counting clock pulses during a time period between two of said logic level transition output signals;

enabling the step of counting clock pulses during a time period between two of said logic level transition output signals, said time period corresponding to a width of a preselected pulse in said pulse width modulated waveform; and comparing an output obtained in said step of counting pulses with a predetermined count and comparing the number of said logic level transitions in said pulse width modulated waveform during said measurement interval with a predetermined number to obtain an operational status indication of said pulse width modulated waveform.

9. A pulse width modulated waveform measurement method as recited in claim 8, further comprising the step of:

producing a polarity signal representative of the logic level of said preselected pulse; and using said polarity signal to obtain said operational status indication of said pulse width modulated waveform.

10. A pulse width modulated waveform measurement method as recited in claim 8, wherein:

said step of generating output signals is further defined by generating said output signals only in response to rising edges of said pulse width modulated waveform.

11. A pulse width modulated waveform measurement method as recited in claim 8, wherein:

said step of generating output signals is further defined by generating said output signals in response to both rising and falling edges of said pulse width modulated waveform.

12. A pulse width modulated waveform measurement method as recited in claim 8, wherein:

said pulse width modulated waveform is a composite signal representative of inverter drive logic signals in an electronic inverter.

* * * * *